United States Patent [19]
Horita et al.

[11] Patent Number: 5,500,502
[45] Date of Patent: Mar. 19, 1996

[54] BONDING METHOD AND APPARATUS

[75] Inventors: Manabu Horita; Masaharu Yoshida; Masataka Takehara, all of Fukuoka, Japan

[73] Assignee: Mitsubishi Denki Kabushiki Kaisha, Tokyo, Japan

[21] Appl. No.: 82,500

[22] Filed: Jun. 28, 1993

[30]    Foreign Application Priority Data

Jun. 30, 1992  [JP]  Japan ................................. 4-172891

[51] Int. Cl.⁶ ............................................. B23K 26/00
[52] U.S. Cl. ............................ 219/121.63; 219/121.64; 219/121.83
[58] Field of Search ................. 219/121.83, 121.63, 219/121.64, 121.85

[56]            References Cited

U.S. PATENT DOCUMENTS

| | | | |
|---|---|---|---|
| 4,696,104 | 9/1987 | Vanzetti et al. | 29/840 |
| 4,845,335 | 7/1989 | Andrews et al. | 219/121.63 |
| 5,196,672 | 3/1993 | Matsuyama et al. | 219/121.83 |
| 5,283,416 | 2/1994 | Shirk | 219/121.83 |

FOREIGN PATENT DOCUMENTS

| | | | |
|---|---|---|---|
| 63-43785 | 2/1988 | Japan . | |
| 2278148 | 11/1990 | Japan . | |
| 356844 | 3/1991 | Japan . | |
| 4272122 | 9/1992 | Japan | 219/121.83 |

OTHER PUBLICATIONS

Jafari, S. u. a., Dusseldorf, 1993.

*Primary Examiner*—Mark H. Paschall
*Attorney, Agent, or Firm*—Leydig, Voit & Mayer

[57]           ABSTRACT

An apparatus for bonding lead terminals to bumps of a semiconductor chip by using a laser beam. On the basis of a temperature signal obtained from irradiation of a lead terminal and a bump to be bonded together under irradiation of the laser beam, state of contact and the bond between the bump and the lead terminal are decided. The bonding between the terminals and the bumps can be realized without fail by checking the state of contact therebetween in precedence to the bonding operation.

17 Claims, 3 Drawing Sheets

BONDING METHOD AND APPARATUS

BACKGROUND OF THE INVENTION

1. Field of the Invention

The present invention relates generally to a method and apparatus for bonding together elements or parts (members in more general sense) of semiconductor devices or the like by making use of a laser beam. More particularly, the invention is concerned with a bonding method and an apparatus for bonding and evaluating the quality of the bonds formed.

2. Description of the Related Art

For a better understanding of the invention, the technical background will first be described in some detail.

FIG. 4 is a vertical sectional view showing an exemplary structure of a bonding apparatus known heretofore and referred to as a tape automated bonding or TAB apparatus, which is disclosed in Japanese Unexamined Patent Application Publication No. 151464/1983 (JP-A-58-151464). The bonding apparatus includes a base 101 having a top portion formed with a recess in which a follower ball receiving fixture 103 having a substantially hemispherical bearing cavity is fitted. A follower ball 105 having a substantially hemispherical shape complementary to that of the cavity is universally rotatable within the semicircular cavity formed in the ball receiving fixture 103. The hemispherical follower ball 105 has a top surface having a hole in which a supporting stage 107 made of an insulation material is fixedly secured. The supporting stage 107 is adapted for supporting fixedly thereon a semiconductor chip 111 having a plurality of bumps 111A as the parts or members to which lead terminals mentioned below are to be bonded. Disposed above and in opposition to the supporting stage 107 is a bonding tool 113 which can be moved in the vertical direction toward and away from the supporting stage 107. Additionally, there is disposed above the supporting stage 107 in the vicinity of the semiconductor chip 111 a lead frame 115 having a plurality of lead terminals 115A which are to be bonded to the bumps of the semiconductor chip 111 mentioned above.

In operation of the bonding apparatus of the structure described above, the semiconductor chip 111 is fixedly secured onto the supporting stage 107 in such a disposition that a surface of the chip 111 having the bumps 111A is exposed upwardly. Subsequently, the lead frame 115 having a lead terminals 115a is disposed on the semiconductor chip 111 so that terminal edge portions of the lead terminals 115A exposed by partially delaminating a protection tape 117 covering the corresponding surface of the lead frame are brought into contact with the bumps 111A, respectively, of the semiconductor chip 111. Thereafter, the bonding tool 113 is lowered to a position where the terminal edge portions of the lead terminals 115A are pressed against the bumps 111A, whereon a bottom tip portion of the bonding tool 113 is heated to weld the terminal edge portions of the lead terminals 115A to the corresponding bumps 111A simultaneously. In that case, when the lead frame 115 does not extend precisely parallel to the top surface of the semiconductor chip 111 but is slightly inclined relative to the latter, gaps will appear between some of the plural lead terminals 115A and some of the bumps 111A, i.e., an unsatisfactory contact state between the lead terminals 115A and the bumps 111A. In that case, the follower ball 105 of the substantially hemispherical shape is caused to rotate correspondingly within the cavity 103 of the complementary shape, following the pressure exerted by the bonding tool 113, to thereby adjust the disposition of the semiconductor chip 111 such that the top surface thereof extends essentially parallel to the lead frame 115, whereby close or intimate contact is established between the lead terminals 115A and the bumps 111A.

The known bonding apparatus for bonding together simultaneously a plurality of the lead terminals 115A and a plurality of bumps 111A en bloc as described above can certainly operate satisfactorily when the number of the lead terminals and the bumps to be bonded together is relatively small. However, when the number of the lead terminals and the bumps increases, in a semiconductor device of high integration density, it becomes very difficult to realize close contact between all the lead terminals 115A and all the corresponding bumps 111A in a satisfactory manner notwithstanding the adjustment between the lead frame 115 and the semiconductor chip 111 by means of the follower ball adjustment mechanism. In other words, a great difficulty is encountered in realizing bonding of high or satisfactory quality between the lead terminals 115A of the lead frame and the corresponding bumps 111A of the semiconductor chip without reduced yield.

Besides, the known bonding apparatus such as described above is not capable of inspecting the state of the bond as formed. Consequently, after the bonding process, the semiconductor chip 115 having the lead terminals 115A bonded thereto has to be transported to another place where an inspection apparatus or equipment is installed for inspecting the quality of the bond. Thus, a time-consuming procedure is involved for determining the quality of the bond, degrading the efficiency of manufacture of the semiconductor devices as a whole.

SUMMARY OF THE INVENTION

In the light of the state of the art described above, it is contemplated with the present invention to solve the problems by providing a bonding method and a bonding apparatus in which a laser beam is used instead of the mechanical bonding tool for bonding the lead terminals and the bumps individually without reduced efficiency.

Another object of the invention is to provide a bonding method and a bonding apparatus which allow the quality of the bond as formed to be determined in situ immediately after the bonding operation.

In view of the above and other objects which will become apparent as description proceeds, there is provided according to an aspect of the present invention a bonding apparatus which comprises laser irradiation means for bonding parts to be bonded together with a laser beam, temperature sensor means for detecting temperature of the bond thus formed, and decision means for deciding the quality of the bond on the basis of a detection signal derived from the output of the temperature sensor means.

Further, according to another aspect of the present invention, there is provided a bonding method which comprises the steps of bonding together parts to be bonded with a laser beam, detecting the temperature of the bond thus formed, and deciding the quality of the bond on the basis of the temperature detected.

With the bonding method and apparatus according to the invention, members or parts to be bonded together such as bumps of a semiconductor chip and lead terminals of a lead frame or the like are bonded through irradiation with a laser beam, and the temperature of the bond thus formed is detected for making a decision concerning the quality of the bond. Further, the parts of concern such as the bumps and the lead terminals are bonded individually, whereby a failure in the bonding, which leads to defective product can be positively avoided.

The above and other objects, features and attendant advantages of the present invention will more easily be understood by reading the following description of the preferred embodiments thereof taken, only by way of example, in conjunction with the drawings.

DESCRIPTION OF THE PREFERRED EMBODIMENTS

Now, the present invention will be described in detail in conjunction with preferred or exemplary embodiments thereof by reference to the drawings.

Figure 1:
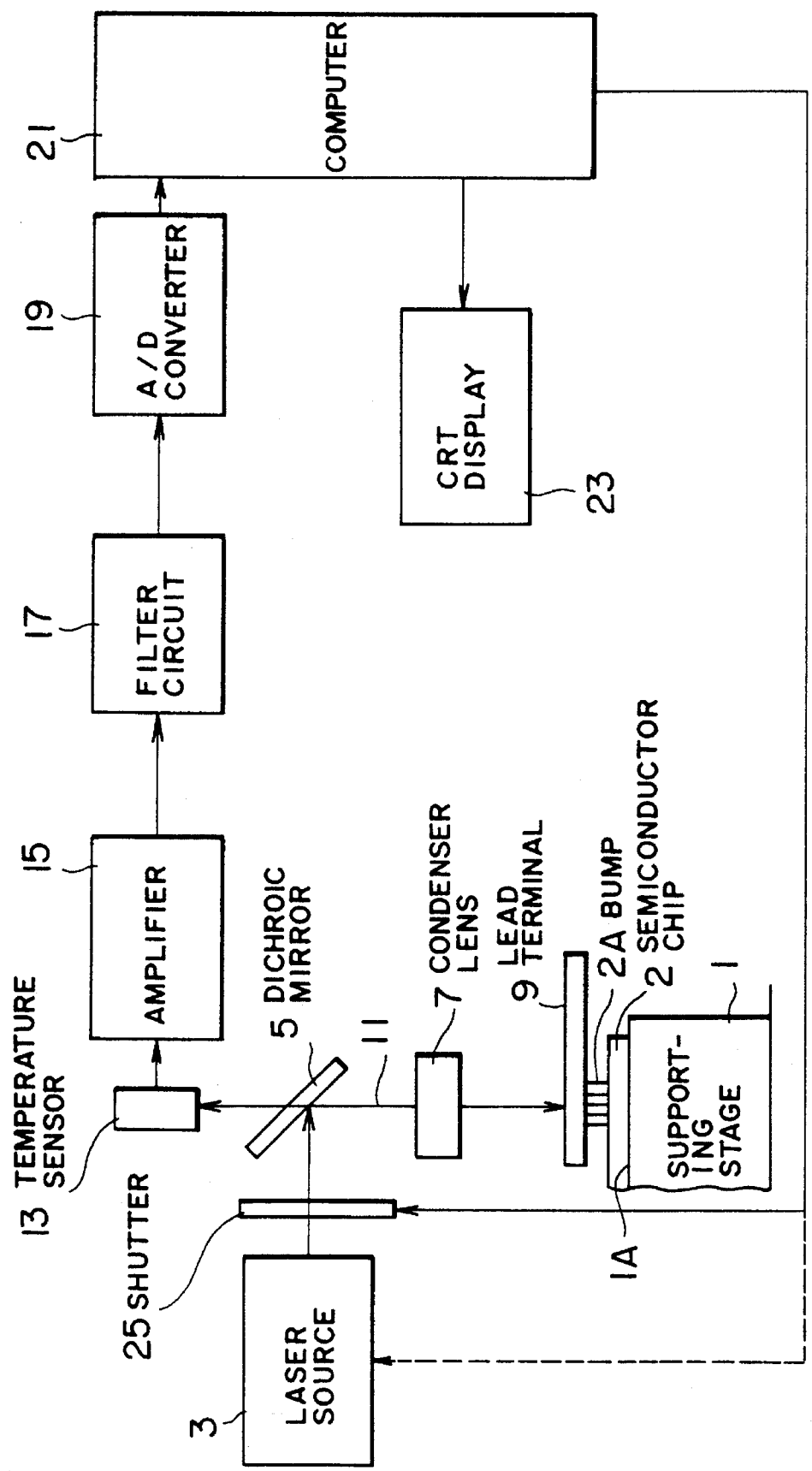
FIG. 1 is a block diagram showing schematically a structure of a bonding apparatus according to an embodiment of the present invention.
Figure 2:
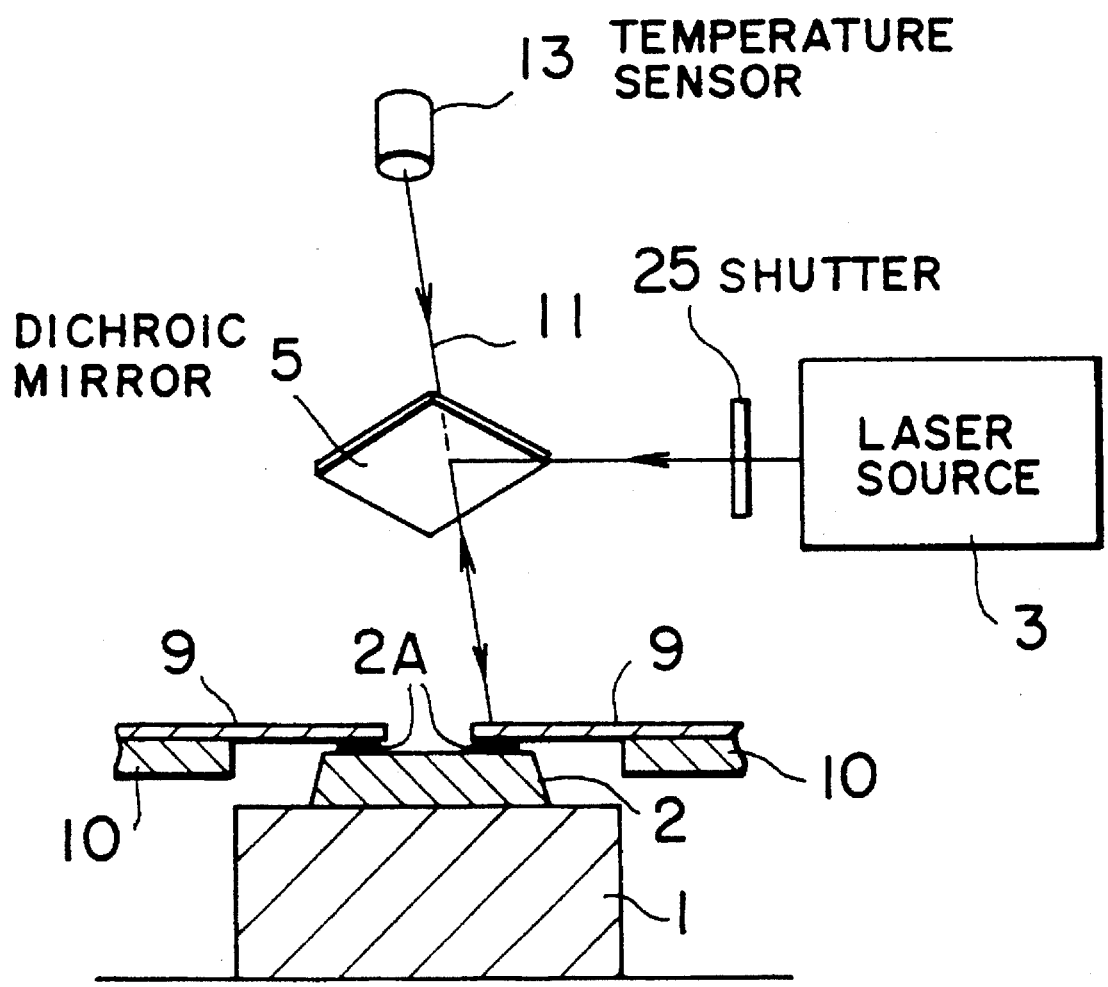
FIG. 2 is an enlarged fragmentary side elevational view showing a main portion of an inner lead bonding (ILB) apparatus to which the embodiment of the invention shown in FIG. 1 is applied.

FIG. 1 is a block diagram showing schematically a structure of a bonding apparatus according to an embodiment of the present invention, and FIG. 2 is an enlarged fragmentary side elevational view showing schematically a major portion of an inner lead bonding (ILB) apparatus to which the embodiment of the invention shown in FIG. 1 is applied.

Referring to FIG. 1, a supporting base 1 having a flat supporting surface 1A for supporting thereon a part to be processed such as a semiconductor chip 2 or the like is, for example, an X-Y stage which can be moved with a high positional accuracy in an essentially horizontal plane, i.e., in and along an X-Y plane. Disposed above the supporting stage 1 is a laser source 3, while a spectrum-selective transmission/reflection mirror 5 such as a dichroic mirror (hereinafter, this mirror 5 will be referred to as the dichroic mirror only for the purpose of convenience of description) is disposed between the laser source 3 and the supporting surface 1A of the stage 1 so as to deflect a laser light beam emitted from the laser source 3 toward the supporting stage 1. A condenser lens 7 is disposed in the optical path between the dichroic mirror 5 and the supporting stage 1. The laser beam reflected at the dichroic mirror 5 is focused by the condenser lens 7 for illuminating or irradiating the parts to be bonded such as one of bumps 2A of the semiconductor chip 2 and one of the edge portions of the lead terminal 9 of a lead frame.

There is disposed on the supporting surface 1A of the stage 1 the semiconductor chip 2 having a top surface on which bumps for bonding are located. Further, a lead frame having a plurality of lead terminals 9 which are also subjected to the bonding operation is disposed on the semiconductor chip 2 in such a manner that tip end portions of the lead terminals 9 exposed by delaminating an insulation tape 10 abut the bumps 2A of the semiconductor chip 2.

The dichroic mirror 5 is disposed at a predetermined angle of inclination relative to the optical axis of the laser beam 11 emitted from the laser source 3, whereby the laser beam 11 from the laser source 3 is reflected at the dichroic mirror 5 focused by the condenser lens 7 to irradiate a tip end portion of the lead terminal 9 of the semiconductor chip 9 resting stationarily on the supporting stage 1. The tip end portion of the lead terminal irradiated by the laser beam 11 is heated and emits infrared rays which are selectively transmitted through the dichroic mirror 5 and received by a temperature sensor 13 which may be an infrared sensor known per se in the art.

The temperature sensor 13 generates an electric signal such as an output voltage signal having an amplitude representing a temperature which corresponds to the quantity of infrared rays impinging on the temperature sensor. The output signal of the temperature sensor 13 is first amplified by an amplifier 15 and then supplied to a filter circuit 17, a low-pass filter well known in the art, whereby the output signal of the amplifier 15 is smoothed with high frequency components due to noise being eliminated. The output signal of the filter circuit 17 is then converted to a digital signal by an analogue-to-digital or A/D converter 19, the digital signal output from the A/D converter 19 being then supplied to a computer 21.

The computer 21 is so programmed as to determine or decide the state of contact between the lead terminal 9 and the bump 2A as well as the state of the bond formed therebetween on the basis of the input signal supplied from the A/D converter 19, the result of the decision being displayed on a display unit 23 which may be a CRT (cathode ray tube) display unit or the like.

Additionally, a shutter 25 is disposed between the laser source 3 and the dichroic mirror 5 for cutting off the laser beam 11 in response to a corresponding command issued from the computer 21.

Next, the description will turn to operation of the bonding apparatus according to the instant embodiment of the invention by referring to FIG. 2 as well. At first, a semiconductor chip 2 having bumps 2A formed on one surface thereof is disposed fixedly on the supporting surface 1A of the stage 1. A lead frame is positioned stationarily on the semiconductor chip 2 in such disposition that tip end portions of lead terminals 9 exposed by removing a protecting insulation tape about the bumps 2A, respectively, of the semiconductor chip 2. In this state, the stage 1 is moved to position or index the contacting portion between a lead terminal 9 and a bump 2A at a focal point of the condenser lens 7. Subsequently, the shutter 25 is opened and the laser source 3 is activated to emit the laser beam 11 for the purpose of inspecting or examining the state of contact between the lead terminal 9 and the bump 24. The laser beam 11 emitted from the laser source 3 is focused by the condenser lens 7 so as to impinge onto the contacting portion of the lead terminal 9 and the bump 2A, whereby the contacting portion is heated under irradiation of the laser beam 11. At this juncture, it should be mentioned that energy of the laser beam 11 generated by the laser source 3 for checking the state of contact as mentioned above is set at an intensity which is required only for the purpose of checking or examining the state of contact between the lead terminal 9 and the bump 2A, i.e., such intensity that even when the state of contact is unsatisfactory, the lead terminal 9 is prevented from being fused or molten under irradiation of the laser beam. Consequently, no fusion of the lead terminal 9 and the bump 2A can take place. Besides, even in the case of the contact failure in which the lead terminal 9 is not in contact with the bump 2A, the lead terminal 9 is protected against injury due to an excessive increase in the temperature brought about by the irradiation with the laser beam. At this time, infrared rays are emitted from the contacting portion between the lead terminal 9 and the bump 2A, wherein a part of the infrared rays can reach the dichroic mirror 5 through the condenser lens 7. The dichroic mirror 5 has such spectral selective transmission characteristics that only the infrared rays are transmitted through the mirror 5 while the laser rays emitted from the laser source and those reflected from the contacting portion as well as visible rays are reflected. The infrared rays transmitted through the dichroic mirror 5 are received by the temperature sensor 13 and converted into an electric signal (analogue voltage signal) having an amplitude corresponding to the quantity of infrared rays impinging on the temperature sensor 13. The output signal of the temperature sensor 13 is amplified through the amplifier 15 and then inputted to the filter circuit 17 where the high frequency components due to noise are eliminated. The smoothed output signal from the filter circuit 17 then undergoes A/D conversion through the A/D converter 19, the digital output signal thereof being supplied to the computer 21. In the computer 21, the output signal from the A/D converter 19 at the time of irradiation by the laser beam mentioned above (or alternatively an integral of the input signal of the A/D converter 19 from a time at which the irradiation by the laser beam is started to a time corresponding to a predetermined time lapse from the start of irradiation by the laser beam) is compared with a predetermined threshold value. Unless the threshold value is exceeded, it is decided that the state of contact between the lead terminal 9 and the bump 2A is satisfactory, and, if otherwise, a decision is made that the state of contact between the lead terminal 9 and the bump 2A is unsatisfactory. The result of the decision is displayed on a screen of the CRT display unit 23.

When it is decided that the state of contact between the lead terminal 9 and the bump 2A is satisfactory, the laser source 3 is again activated to irradiate the contacting portion of the lead terminal 9 and the bump 2A with the laser beam 11. In this case, the intensity of the laser beam 11 is set to be significantly greater than that used for detecting the state of contact so that the contacting portion of the lead terminal 9 and the bump 2A is heated to a temperature which is sufficiently high to fuse or melt the contact portion. At the same time, the infrared rays emanating from the contacting portions are detected by the temperature sensor 13 after having passed the condenser lens 7 and the dichroic mirror 5, and the output electric signal from the temperature sensor 13 whose amplitude is in proportion to the quantity of the impinging infrared rays is supplied to the computer 21 via the amplifier 15, the filter circuit 17 and the A/D converter 19. On the basis of the input signal representing the detected temperature, the computer 21 decides the quality of the bond formed between the lead terminal 9 and the bump 2A, the result of the decision being displayed on the CRT display unit 23. A decision as to the quality of the bond between the lead terminal 9 and the bump 2A is effectuated through comparison with the signal representative of the temperature detected by the temperature sensor 13 and a preset threshold value stored in the computer 21 and representing the normal bond. By way of example, in the case of a failure of bonding in which the lead terminal 9 is floating above the corresponding bump 2A, heat cannot be diffused from the lead terminal 9 heated by the laser beam 11 into the semiconductor chip via the bump 2A, resulting in increased heat dissipation. Consequently, when the comparison with the threshold level results in a deviation from the threshold level, a decision is made that the state of bonding is unsatisfactory. Of course, other types of contact failures can be detected through comparison of the output signals of the temperature sensor 13 generated in response to temperatures at the peripheral areas of the bond by the computer 21 by taking into consideration the size and the position of the heat source and of the lead terminal 9.

When it is decided that the state of bonding between the lead terminal 9 and the bump 2A is unsatisfactory, the laser beam 11 is intercepted by closing the shutter 25 or alternatively stopping the pumping operation of the laser source 3. In this manner, abnormal heating of the lead terminal 9 under the irradiation with the laser beam 11 can be prevented beforehand, whereby the lead terminal 9 can be protected against injury which the lead terminal 9 will suffer otherwise.

In the above description of the preferred embodiment of the invention, it is assumed that the high frequency components due to noise contained in the output signal of the temperature sensor 13 are eliminated through the filter circuit 17. It should, however, be understood that elimination of the noise components can equally be effectuated by the computer 21 by resorting to a moving average method (i.e., a method according to which sample values before and after a predetermined time point are averaged and a resulting value is used as a succeeding sample value) and a minimum square method known in the art.

In the case of the embodiment described above, a decision as to the quality of bonding is checked after the bonding has been completed by the irradiation of the laser beam 11. However, in practice, a satisfactory contact between the lead terminal and the bump will naturally result in formation of the satisfactory bond. Accordingly, the decision as to the quality of the bond may be spared, as occasion permits.

Figure 3:
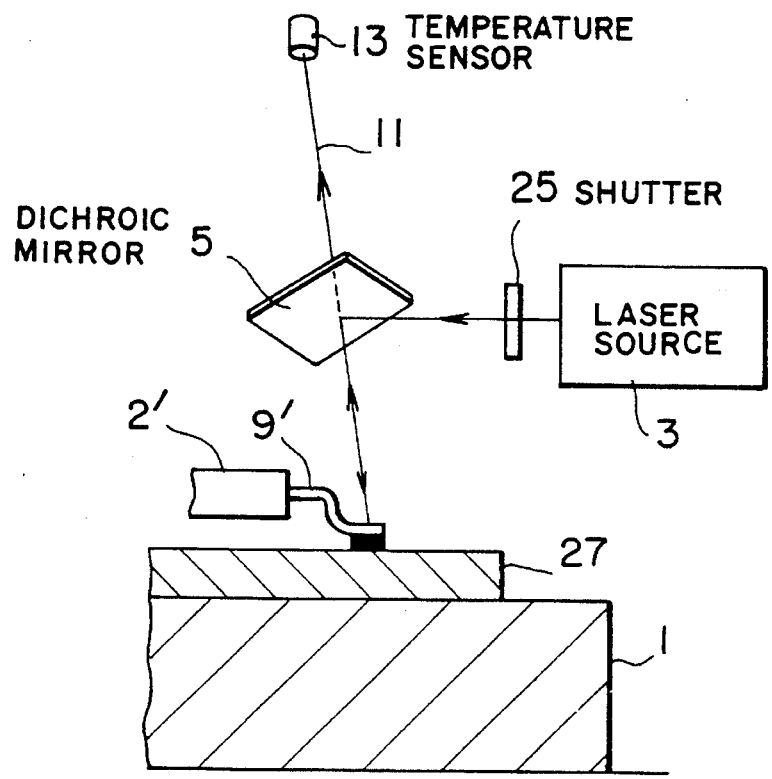
FIG. 3 is an enlarged fragmentary side elevational view showing a main portion of an outer lead bonding (OLB) apparatus to which the embodiment of the invention shown in FIG. 1 is applied.
Figure 4:
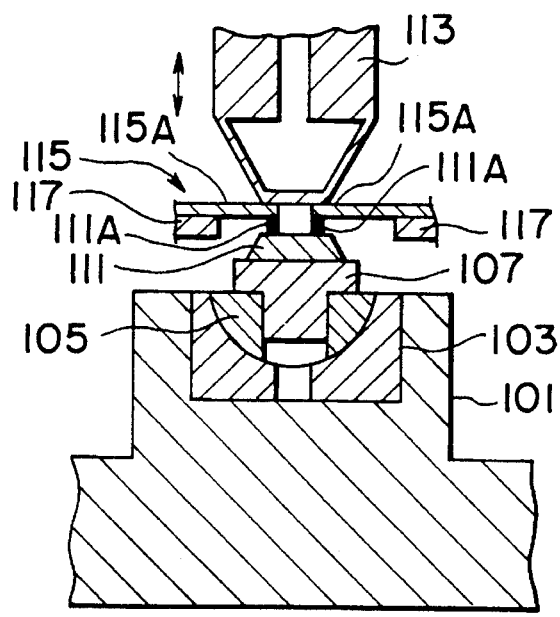
FIG. 4 is a vertical sectional view showing an exemplary structure of a bonding apparatus known heretofore.

In the foregoing description, it has been assumed that the inner edge portions of the lead terminals 9 are bonded to the bumps 2A of the semiconductor chips 2 (i.e., ILB bonding apparatus), as is illustrated in FIG. 2. The present invention can equally be applied to an outer lead bonding (OLB) apparatus which is designed for bonding outer edge portions of lead terminals 9' of a semiconductor chip 2' to bumps of a semiconductor device, as is illustrated in FIG. 3. Even in that case, the basic structure and operation of the bonding apparatus are substantially same as those of the inner lead bonding (ILB) apparatus described above. Accordingly, repeated description of the OLB apparatus will be unnecessary.

When the bonding operation is completed for a pair of a lead terminal and a bump, a succeeding pair is positioned at the focal point of the condenser lens 7 by indexing correspondingly the supporting stage, whereon the contact check and bonding operation are repeated.

As will be appreciated from the foregoing description, it is possible with the structure of the bonding apparatus according to the invention to perform the bonding operation without fail by using the laser beam on a one-by-one basis at a high speed, whereby the quality of the bonds as formed can be improved significantly with the yield of the products being increased. Further, by checking the state of contact between the lead and the bump with a laser beam of a feeble intensity, efficiency of the bonding operation can be enhanced, while ensuring more positive quality for the bonds as formed.

Many features and advantages of the present invention are apparent from the detailed specification and thus it is intended by the appended claims to cover all such features and advantages of the system which fall within the true spirit and scope of the invention. Further, since numerous modifications and combinations will readily occur to those skilled in the art, it is not intended to limit the invention to the exact construction and operation illustrated and described. Accordingly, all suitable modifications and equivalents may be resorted to, falling within the spirit and scope of the invention.

We claim:

1. An apparatus for bonding a first member to a second member comprising:

laser irradiation means for producing a laser beam for bonding together first and second members by irradiation with the laser beam, said irradiation means including a laser source for emitting the laser beam, a spectrally selective reflection/transmission mirror for reflecting the laser beam toward the first and second members, and a condenser lens for focusing the laser beam at a focal point at which the first and second members are disposed;

means for checking the contact between the first and second members prior to bonding the first and second members together;

temperature sensor means for detecting temperature of a bond formed by laser irradiation; and decision means for deciding quality of a bond from a detection signal supplied by said temperature sensor means.

2. The bonding apparatus according to claim 1 comprising:

supporting means for supporting the first and second members, one on top of the other, said supporting means being movable in a substantially horizontal X-Y plane; and control means for moving said supporting means stepwise to a position at which the first and second members are located at the focal point of said condenser lens for bonding together the first and second members by irradiation with the laser beam.

3. The bonding apparatus according to claim 1 wherein said mirror transmits infrared rays, and said temperature sensor means includes a temperature sensor disposed at a position for receiving infrared rays emitted by the first and second members in response to irradiation of the first and second members with the laser beam having passed through said mirror.

4. The bonding apparatus according to claim 1 including an analogue-to-digital converter and a display unit wherein said decision means is a computer to which the output of said temperature sensor means is supplied through said analogue-to-digital converter as a digital signal, said computer being programmed to compare the digital signal with a predetermined value representing a normal bond and to generate a signal indicating the result of the comparison on said display unit.

5. The bonding apparatus according to claim 1 wherein the first member is a lead terminal of a lead frame having a plurality of lead terminals extending inwardly, and the second member is a bump on a surface of a semiconductor chip.

6. The bonding apparatus according to claim 1 wherein the first member is a lead terminal of a lead frame having a plurality of lead terminals extending outwardly, and the second member is a bump on a surface of a semiconductor chip.

7. An apparatus for bonding a first member to a second member comprising:

laser irradiation means for producing a laser beam for bonding together first and second members by irradiation with the laser beam;

temperature sensor means for detecting temperature of a bond formed by laser irradiation;

decision means for deciding quality of a bond from a detection signal supplied by said temperature sensor means; and means for checking contact between the first and second members before bonding the first and second members together.

8. The bonding apparatus according to claim 7 wherein said means for checking contact includes:

a spectrally selective reflection/transmission mirror for reflecting the laser beam toward the members to be bonded together;

a condenser lens for focusing the laser beam at a focal point at which the members are disposed;

control means for controlling intensity of the laser beam such that irradiation of the first and second members with the laser beam does not bring about bonding, said temperature sensor means comprising a temperature sensor disposed at a position for receiving infrared rays emitted by the first and second members in response to irradiation of the first and second members with by the laser beam of controlled intensity; and decision means for deciding the state of contact between the first and second members from a detection signal supplied by said temperature sensor means.

9. An apparatus for bonding lead terminals to bumps of a semiconductor chip comprising:

supporting means for supporting a semiconductor chip having a plurality of bumps and a lead frame having a corresponding number of lead terminals with each of the bumps in contact with a corresponding lead terminal, said supporting means being movable stepwise in a substantially horizontal plane;

a laser source disposed above said supporting means for emitting a laser beam;

a spectrally selective reflection/transmission mirror for deflecting the laser beam toward said supporting means;

a condenser lens for focusing the laser beam at a focal point corresponding to a position where one of the lead terminals and one of the bumps are positioned in contact with each other;

temperature sensor means for detecting infrared rays emitted from a portion of the lead terminal contacting a bump in response to irradiation by the laser beam;

control means for controlling intensity of the laser beam such that the intensity of the laser beam is low for detecting the contact between a lead terminal and a bump and high to form a bond between the lead terminal and the bump in contact with each other; and decision means for deciding whether a lead terminal is in contact with a bump prior to bonding the lead terminal to the bump, and the quality of a bond between the lead terminal and the bump from an output of said temperature sensor means.

10. The bonding apparatus according to claim 9 wherein said control means moves said supporting means stepwise so that a succeeding lead terminal and bump pair is positioned at the focal point of said condenser lens when bonding has been performed satisfactorily for a preceding lead terminal and bump pair.

11. A bonding method comprising:

supporting first and second members on top of each other movably in a substantially horizontal X-Y plane;

emitting a laser beam;

reflecting the laser beam toward the first and second members;

checking contact between the first member and the second member before bonding said first and second members together;

focusing the laser beam to a focal point on parts of the first and second members;

controlling the intensity of the laser beam that irradiates the parts of the first and second members so that the laser beam bonds the parts of the first and second members together;

detecting the temperature of a bond during bonding;

deciding bond quality on the basis of the detected temperature; and moving the first and second members stepwise relative to the focal point and repeating the foregoing steps thereby bonding together the first and second members at a plurality of points by irradiation with the laser beam.

12. The bonding method according to claim 11 wherein said first member is a lead terminal of a lead frame having a plurality of lead terminals extending inwardly, and said second member is a bump formed on a surface of a semiconductor chip.

13. The bonding method according to claim 11 wherein said first member is a lead terminal of a lead frame having a plurality of lead terminals extending outwardly, and said second member is a bump formed on a surface of a semiconductor chip.

14. A bonding method comprising:

checking contact between a first member and a second member before bonding said first and second members together;

emitting a laser beam;

reflecting the laser beam toward the first and second members;

focusing the laser beam to a focal point at which the first and second members are disposed;

controlling the intensity of the laser beam so that the laser beam bonds the first and second members together;

detecting the temperature of the bond during bonding; and deciding bond quality on the basis of the detected temperatures.

15. The bonding method according to claim 14 wherein contact state checking includes:

emitting a laser beam;

reflecting the laser beam toward the first and second members to be bonded together;

focusing the laser beam at the focal point at which said first and second members are disposed; and controlling the intensity of the laser beam such that irradiation of said first and second members with the laser beam does not bring about bonding of said first and second members; and deciding the state of the contact between said first and second members from a detection signal supplied by said temperature sensor means.

16. A method for bonding lead terminals to bumps of a semiconductor chip comprising:

supporting a semiconductor chip having a plurality of bumps and a lead frame having a corresponding number of lead terminals extending therefrom so that each of said bumps is brought into contact with a corresponding lead terminal;

deflecting a laser beam toward said semiconductor chip;

focusing the laser beam at a focal point where one of said lead terminals and one of said bumps are positioned in contact with each other;

detecting infrared rays emitted by a portion of said lead terminal contacting a bump in response to irradiation by the laser beam;

controlling the intensity of the laser beam detecting contact between said lead terminal and said bump without bonding said lead terminal and said bump together and controlling the intensity of the laser beam so that a bond is formed between said lead terminal and said bump in contact with each other; and deciding whether a lead terminal is in contact with said bump prior to bonding the lead terminal to the bump and determining the quality of a bond formed between said lead terminal and said bump from infrared rays emitted from said lead terminal and said bump.

17. The bonding method according to claim 16 wherein said semiconductor chip and said lead frame are moved so that a succeeding lead terminal and bump are positioned at a focal point of said condenser lens when bonding has been performed satisfactorily for a preceding lead terminal and bump.

* * * * *